(12) United States Patent
Schnarr

(10) Patent No.: US 7,664,216 B2
(45) Date of Patent: Feb. 16, 2010

(54) DIGITAL FREQUENCY LOCKED DELAY LINE

(75) Inventor: Curt Schnarr, Richfield, MN (US)

(73) Assignee: Micron Technology, Inc., Boise, ID (US)

( * ) Notice: Subject to any disclaimer, the term of this patent is extended or adjusted under 35 U.S.C. 154(b) by 837 days.

(21) Appl. No.: 10/912,441

(22) Filed: Aug. 5, 2004

(65) Prior Publication Data

US 2006/0029175 A1    Feb. 9, 2006

(51) Int. Cl.
   *H03D 3/24*    (2006.01)
(52) U.S. Cl. ...................................... 375/376
(58) Field of Classification Search ................ 375/376, 375/373, 327, 294; 329/325, 360; 327/147, 327/153, 156, 271, 273, 284, 286
   See application file for complete search history.

(56) References Cited

U.S. PATENT DOCUMENTS

| | | | |
|---|---|---|---|
| 4,890,071 A | 12/1989 | Curtis | ........................ 331/11 |
| 5,252,867 A | 10/1993 | Sorrells et al. | |
| 5,633,608 A | 5/1997 | Danger | |
| 5,764,092 A | 6/1998 | Wada et al. | |
| 6,114,890 A | 9/2000 | Okajima et al. | |
| 6,137,325 A | 10/2000 | Miller, Jr. | |
| 6,160,860 A | 12/2000 | Larsson | ...................... 375/376 |
| 6,242,955 B1 | 6/2001 | Shen et al. | .................. 327/158 |
| 6,281,726 B1 | 8/2001 | Miller, Jr. | |
| 6,490,207 B2 | 12/2002 | Manning | |
| 6,542,040 B1 | 4/2003 | Lesea | .......................... 331/11 |
| 6,636,093 B1 | 10/2003 | Stubbs et al. | |
| 6,727,739 B2 | 4/2004 | Stubbs et al. | |
| 6,759,883 B2 | 7/2004 | Gomm | |
| 6,774,687 B2 | 8/2004 | Gomm et al. | |
| 6,774,690 B2 | 8/2004 | Baker et al. | |
| 6,777,995 B1 | 8/2004 | Harrison | |
| 6,781,861 B2 | 8/2004 | Gomm et al. | |
| 6,791,381 B2 | 9/2004 | Stubbs et al. | |
| 6,798,259 B2 | 9/2004 | Lin | |
| 6,803,826 B2 | 10/2004 | Gomm et al. | |
| 6,809,974 B2 | 10/2004 | Jones et al. | |

(Continued)

FOREIGN PATENT DOCUMENTS

CA    2309522    11/2000

(Continued)

OTHER PUBLICATIONS

Chung, Ching-Che, et al., "A new DLL-based approach for all-digital multiphase clock generation", *IEEE Journal of Solid-State Circuits*, 39(3), (Mar. 2004), 469-475.

(Continued)

*Primary Examiner*—Khai Tran
(74) *Attorney, Agent, or Firm*—Schwegman, Lundberg & Woessner, P.A.

(57) ABSTRACT

A device includes a signal generator having a delay locked circuit for providing a of output signals based on an input signal. The output signals have a fixed signal relationship with each other and with the input signal. The signal generator also includes a selector for selecting an enable signal from a range of signals formed by the output signals. The device further includes a transceiver circuit in which the transceiver circuit uses the enable signal for data processing.

19 Claims, 8 Drawing Sheets

U.S. PATENT DOCUMENTS

| | | | |
|---|---|---|---|
| 6,809,990 B2 | 10/2004 | Thomann et al. | |
| 6,819,151 B2 | 11/2004 | Mikhalev et al. | |
| 6,819,603 B2 | 11/2004 | Jones et al. | |
| 6,839,301 B2 | 1/2005 | Lin et al. | |
| 6,839,860 B2 | 1/2005 | Lin | |
| 6,842,399 B2 | 1/2005 | Harrison | |
| 6,845,459 B2 | 1/2005 | Lin | |
| 6,850,107 B2 | 2/2005 | Gomm | |
| 6,868,504 B1 | 3/2005 | Lin | |
| 6,876,239 B2 | 4/2005 | Bell | |
| 6,912,666 B2 * | 6/2005 | Lin | 713/401 |
| 2002/0006178 A1 | 1/2002 | Takagi et al. | |
| 2002/0053933 A1 | 5/2002 | Takahashi | |
| 2002/0180500 A1 | 12/2002 | Okuda et al. | |
| 2003/0206043 A1 | 11/2003 | Chung | |
| 2003/0215040 A1 * | 11/2003 | Bell et al. | 375/376 |
| 2004/0117683 A1 * | 6/2004 | Waller | 713/401 |
| 2004/0251936 A1 * | 12/2004 | Gomm | 327/141 |
| 2005/0093597 A1 * | 5/2005 | Kwak | 327/158 |

FOREIGN PATENT DOCUMENTS

| | | |
|---|---|---|
| EP | 315489 | 5/1989 |
| EP | 370170 | 5/1990 |
| EP | 0878910 A2 | 11/1998 |
| TW | 383486 | 9/1997 |

OTHER PUBLICATIONS

Efendovich, A., et al., "Multifrequency zero-jitter delay-locked loop", *IEEE Journal of id-State Circuits*, 29(1), (Jan. 1994),67-70.

Gothandaraman, A., et al., "An all-digital frequency locked loop (ADFLL) with a pulse output direct digital frequency synthesizer (DDFS) and an adaptive phase estimator", *Radio Frequency Integrated Circuits (RFIC) Symposium, 2003 IEEE*, (Jun. 8-10, 2003),303-306.

Hamamoto, T, "A 667-Mb/s operating digital DLL architecture for 512-Mb DDR SDRAM", *IEEE Journal of Solid-State Circuits*, 39(1), (Jan. 2004),194-206.

Ishibashi, K, "A novel clock distribution system for CMOS VLSI", *1993 IEEE International Conference on Computer Design: VLSI in Computers and Processors, 1993. ICCD '93. Proceedings*, (Oct. 3-6, 1993),289-292.

Watanabe, T, et al., "An all-digital PLL for frequency multiplication by 4 to 1022 with seven-cycle lock time", *IEEE Journal of olid-State Circuits*, 38(2), (Feb. 2003),198-204.

"Search Report for International Application No. PCT/US2005/027863", (Nov. 22, 2005), 4 pgs.

"Taiwanese Application Serial No. 94125401, Office Action mailed Oct. 21, 2009", 11 pgs.

"Japanese Application Serial No. 2007-525024, Office Action mailed Nov. 10, 2009", 4 pgs.

US 6,249,165, 06/2001, Harrison (withdrawn)

* cited by examiner

DIGITAL FREQUENCY LOCKED DELAY LINE

FIELD OF INVENTION

The present invention relates generally to semiconductor devices, more particularly, to generation of signals in semiconductor devices.

BACKGROUND

Semiconductor devices such as memory devices, memory controller, and processors reside in many computers and electronic products to store and process data. Most of these devices use electrical signals to communicate with each other or within the same device.

The operating speed of the device depends in part on the frequency of the signals. As semiconductor devices become more advanced, one part of the device may operate at one frequency and another part of the same device or of another device may operate at another frequency. Therefore, synchronizing different operations in different parts of the same device or among different devices may be complex and constrained.

SUMMARY OF THE INVENTION

The embodiments of the present invention provide circuits and methods for generating a range of stable signals over a wide range of frequencies to provide flexibility for semiconductor devices to improve operations within the same device or operations among different devices.

One aspect includes a device having a delay line. The delay line has a number of variable delay cells. Each of the variable delay cells has a number of delay control nodes for receiving a delay code. The device also includes a phase detector for comparing signals from input and output nodes of the delay line. The device also includes a code adjuster responsive to the phase detector for adjusting the delay code. The device further includes a selector for selecting from a range of output signals from multiple output nodes of the variable delay cells to provide an enable signal.

Another aspect includes a method of generating signals. The method sets a delay code to a number of variable delay cells. The method propagates an input signal through the variable delay cells to obtain a delayed output signal. The method adjusts the delayed output signal until the input signal and the delayed output signal have a fixed signal relationship. The method selects from a range of output signals at multiple output nodes of the variable delay cells. The method passes the selected output signal to an enable node.

A further aspect includes a method of processing signals. The method receives at least one data signal and at least one strobe signal. The method propagates an input signal through a number of variable delay cells to obtain a plurality of cell output signals in which each of the cell output signals has a fixed signal relationship with the input signal. The method selects one of the cell output signals to be an enable signal. The method activates at least one receiver to pass at least one of the data and strobe signals from one part of the device to another part of the device.

Other aspects of the embodiments of the present invention will be apparent upon reading the present application including the drawings and claims.

DETAILED DESCRIPTION OF THE EMBODIMENTS

Figure 1:
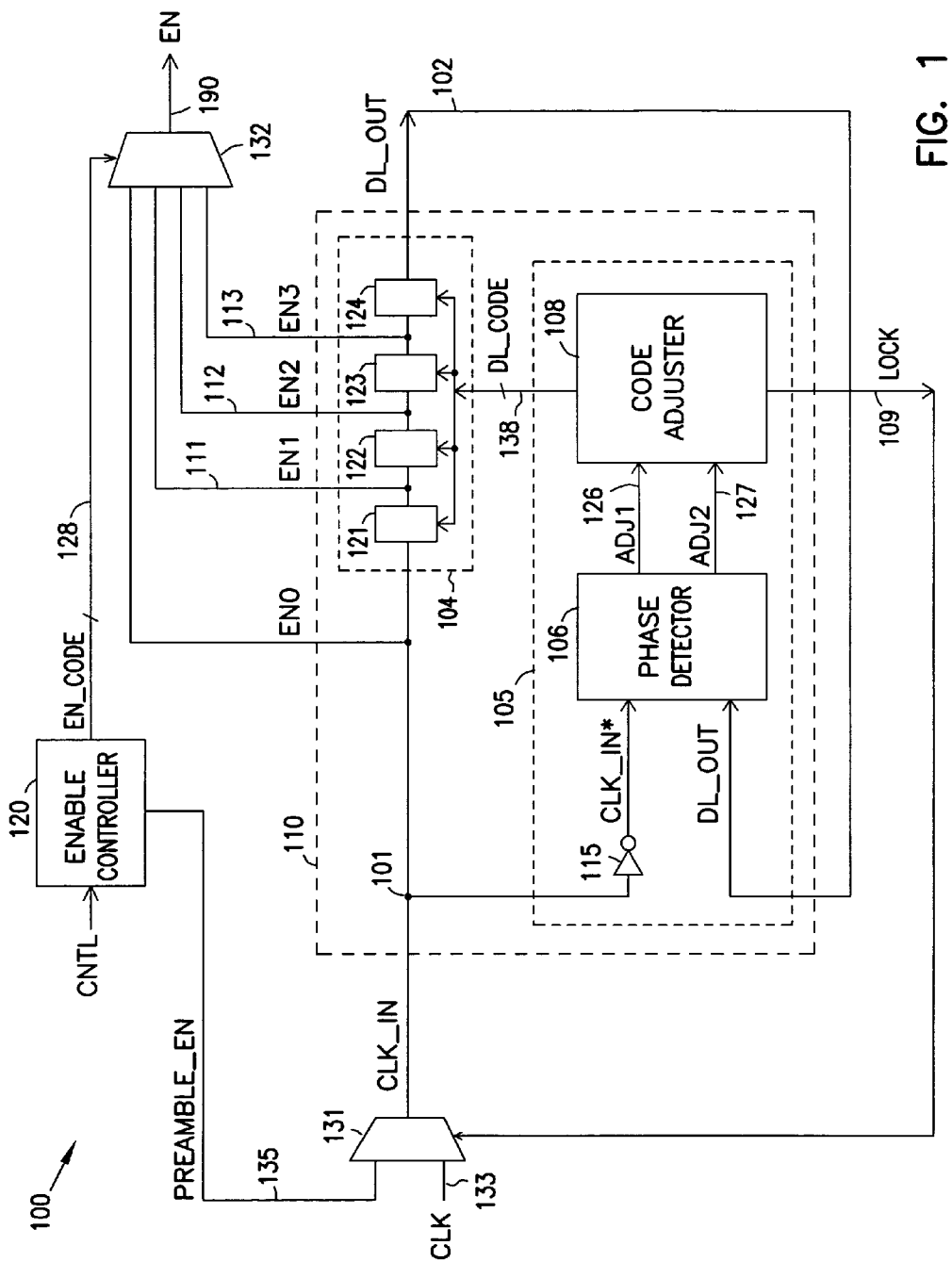
FIG. 1 shows a signal generator having a delay locked circuit according to embodiments of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the claims and all available equivalents.

FIG. 1 shows a signal generator 100 having a delay locked circuit according to embodiments of the invention. Signal generator 100 includes a delay locked circuit 110, an enable controller 120, and selectors 131 and 132. Delay locked circuit 110 receives an input signal CLK_IN at an input node 101 and generates a delayed output signal DL_OUT at an output node 102. The DL_OUT signal is a delayed version of the CLK_IN signal. In some embodiments, the CLK_IN signal is a clock signal. Delay locked circuit 110 also generates a number of cell output signals EN0-EN3 (EN0, EN1, EN2, and EN3) at node 101 and cell output nodes 111, 112, and 113. Delay locked circuit 110 further generates a lock signal LOCK on a select node 109 to control a selection of selector 131.

Selector 131 receives a clock signal CLK on an input node 133 and a preamble signal PREAMBLE_EN on node 135. Based on the state of the LOCK signal, selector 131 selects either the CLK signal or the PREAMBLE_EN signal to be the CLK_IN signal on node 101. In some embodiments, the CLK signal is a clock signal.

Enable controller 120 responds to a control signal CNTL to provide the PREAMBLE_EN signal to selector 131 and to provide an enable code EN_CODE on select nodes 128. In some embodiments, the EN_CODE is a combination of multiple binary bits presented by a number of different signals on different signal lines. FIG. 1 shows lines 128 as a single line for clarity.

Selector 132 uses the EN_CODE to select one of the EN0-EN3 signals to an enable node 190 as the enable EN signal. Thus, the EN signal is one of the EN0-EN3 signals selected by enable controller 120 based on the value of the EN_CODE.

Delay locked circuit 110 includes delay line 104 having a number of delay cells 121-124 (121, 122, 123, and 124), and a delay controller 105 having a phase detector 106, an inversion unit 115, and a code adjuster 108. In the embodiments represented by FIG. 1, delay line 104 includes four delay cells 121-124, as an example. In some embodiments, the number of delay cells of delay line 104 may be different from four. Thus, in some embodiments, the number of cell output signals such as the EN0-EN3 signals may be different from four.

Delay line 104 applies a delay (delay time) to the signal path of the CLK_IN signal between input node 101 and output node 102. The amount of delay applied by delay line 104 is the total of amount of delay of delay cells 121-124. The amount of delay of each of the delay cells 121-124 is controlled by the same (identical) delay code DL_CODE on lines 138. Each of the delay cells 121-124 is a variable delay cell. Since each of the delay cells 121-124 is controlled by the same DL_CODE, each of the delay cells 121-124 has the same or an equal amount of delay regardless of the value of the DL_CODE. In some embodiments, the DL_CODE is a digital code. Thus, in some embodiments, the delay of each of the delay cells 121-124 is controlled digitally.

Phase detector 106 has input nodes for receiving a signal CLK_IN* and the DL_OUT signal. The CLK_IN* signal is inversion of the CLK_IN signal at an output node of an inverter 115. In some embodiments, inverter 115 is included inside phase detector 106. Phase detector 106 has output nodes 126 and 127 for providing adjust signals ADJ1 and ADJ2.

Code adjuster 108 responds to the ADJ1 and ADJ2 signal to output the DL_CODE on lines 138. In some embodiments, the DL_CODE is digital code represented by a combination of multiple binary bits corresponding to a number of different signals on different signal lines. FIG. 1 shows lines 138 as a single line for clarity.

Delay locked circuit 110 uses the CLK_IN signal to generate the DL_OUT signal such that the DL_OUT signals has a signal relationship with the CLK_IN signal. In FIG. 1, the DL_OUT signal is 180 degrees out of phase with the CLK signal.

Delay locked circuit 110 has pre-locked mode and a locked mode. In the pre-locked mode, the phase between the CLK_IN* and DL_OUT signals may not be at a fixed relationship. Delay locked circuit 110 adjusts delay line 104 until the phase between the CLK_IN* and DL_OUT signals is fixed. In FIG. 1, delay locked circuit 110 adjusts delay line 104 until the CLK_IN and DL_OUT signals have the same phase. When the CLK_IN and DL_OUT signals have the same phase, delay locked circuit 110 activates the LOCK signal to put delay locked circuit 110 in the locked mode.

In the pre-locked mode, phase detector 106 compares the difference in phase between the CLK_IN* and DL_OUT signals. In some embodiments, phase detector 106 compares the rising edges (or falling edges) of the CLK_IN* and DL_OUT signals. When the edges of the CLK_IN* and DL_OUT signals are not aligned, phase detector 106 activates one of the ADJ1 signal ADJ2 signals. Code adjuster 108 responds to the ADJ1 or ADJ2 signal to adjust (increase or decrease) the value of the DL_CODE. The value of the DL_CODE controls the amount of delay that delay line 104 applies to the CLK_IN signal. Thus, when the value of the DL_CODE is adjusted, the amount of delay of delay line 104 is also adjusted. The comparison and adjustment process is performed until the CLK_IN* and DL_OUT signals have the same phase. When the CLK_IN* and DL_OUT signals have the same phase, delay locked circuit 110 activates the LOCK signal to put delay locked circuit 110 in the locked mode.

In FIG. 1, since the CLK_IN* signal is an inversion of the CLK_IN signal (180 degrees out of phase with the CLK_IN signal), the DL_OUT signal is also 180 degree out of phase with the CLK_IN signal when delay locked circuit 110 is in the locked mode.

Figure 2:
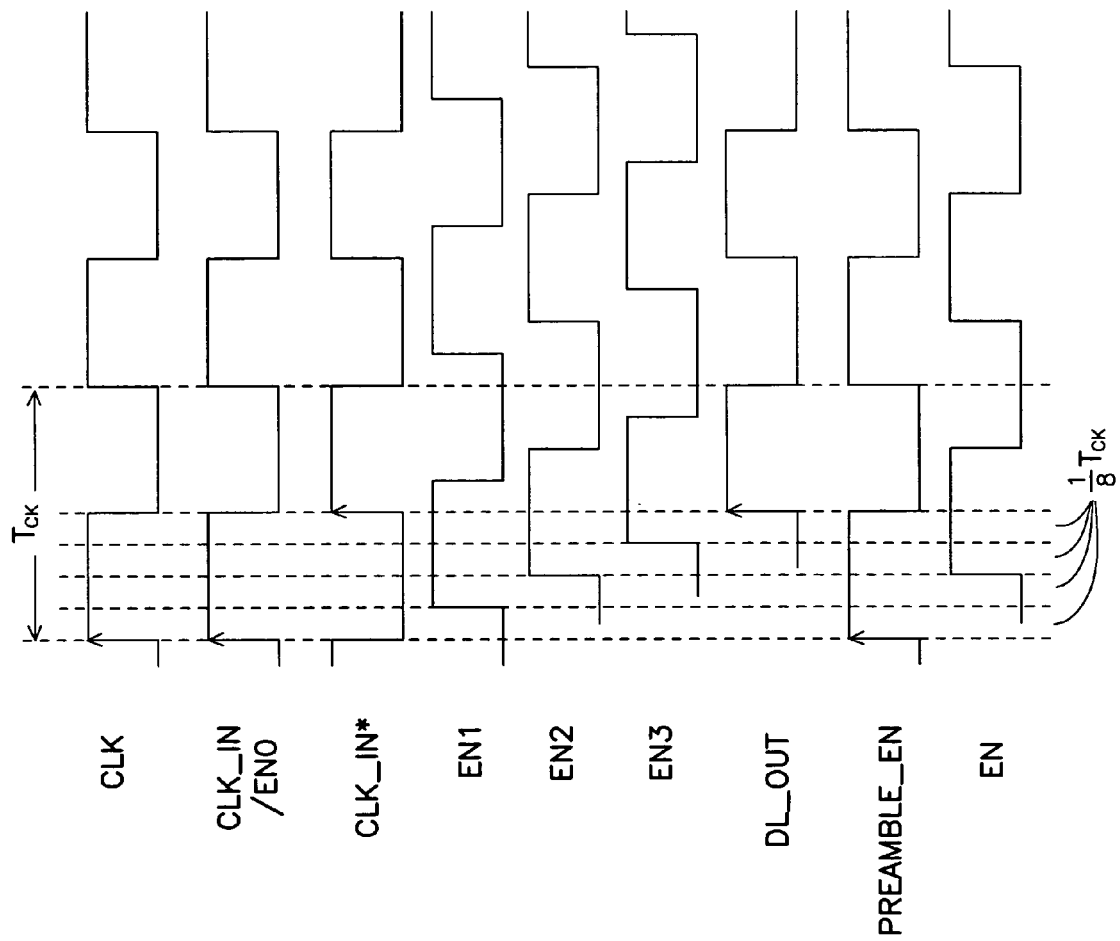
FIG. 2 is an exemplary timing diagram for FIG. 1.

FIG. 2 is an exemplary timing diagram for FIG. 1. FIG. 2 shows the timing of delay locked circuit 100 (FIG. 1) in the locked mode. For clarity, FIG. 2 omits delay caused by selectors 131 and 132. As shown in FIG. 2, the DL_OUT and CLK_IN* signals have the same phase. The DL_OUT signal is 180 degrees out of phase with the CLK_IN signal. $T_{CK}$ indicates the cycle (period) of the CLK or CLK_IN signal.

FIG. 2 shows that the EN0-EN3 signals have a fixed signal relationship with the CLK_IN signal and with each other. As shown in FIG. 2, each of the EN1-EN3 signals has a fixed delay of a multiple of ⅛ $T_{CK}$ (one-eighth clock cycle) relative to the CLK or CLK_IN signal. For example, the EN1 signal has a delay of ⅛ $T_{CK}$ relative to the CLK or CLK_IN signal. As another example, the EN2 signal has a delay of two times ⅛ $T_{CK}$ relative to the CLK or CLK_IN signal. FIG. 2 also shows that each of the EN1-EN3 signals has a fixed delay of a multiple of ⅛ $T_{CK}$ relative to each other. For example, the EN1 signal has a delay of ⅛ $T_{CK}$ relative to the EN2 signal and a delay of two times ⅛ $T_{CK}$ (or one-fourth clock cycle) relative to the EN3 signal.

In some embodiments, each of the EN0-EN3 signals has a fixed delay equal to N times $T_{CK}$ (N $T_{CK}$) relative to the CLK or CLK_IN signal, where N a real number less than one.

Since the EN0-EN3 signals have a fixed signal relationship with the CLK or CLK_IN signal, the frequency of the EN0-EN3 signals changes when the frequency of the CLK or CLK_IN signal changes. However, the fixed relationship remains unchanged. For example, when the cycle of the CLK_IN signal is one (1) nanosecond, each of the EN1-EN3 signals has a fixed delay of a multiple of 0.125 nanosecond (⅛ $T_{CK}$) relative to the CLK_IN signal. As another example, when the cycle of the CLK_IN signal is two (2) nanosecond, each of the EN1-EN3 signals has a fixed delay of a multiple of 0.25 nanosecond, which is still ⅛ $T_{CK}$ relative to the CLK_IN signal.

The PREAMBLE_EN signal has a fixed relationship with the CLK_IN signal. In the embodiments represented by FIG. 2, the PREAMBLE_EN signal has about 50 percent duty cycle. In some embodiments, the duty cycle of the PREAMBLE_EN signal may be different from 50 percent. In some embodiments, the PREAMBLE_EN signal includes a number of pulses in which each rising edge of each of the pulses aligns with a rising edge of the CLK_IN signal.

FIG. 2 shows that a range of signals (EN0-EN3) exists in signal generator 100 in which each signal within the range has a fixed signal relationship with the CLK, CLK_IN, and PREAMBLE_EN signals. Therefore, any one of the EN1-EN3 signals may be used in place of the CLK, CLK_IN, or PREAMBLE_EN signal in situations where the CLK, CLK_IN, or PREAMBLE_EN signal is an unsuitable choice.

Figure 3:
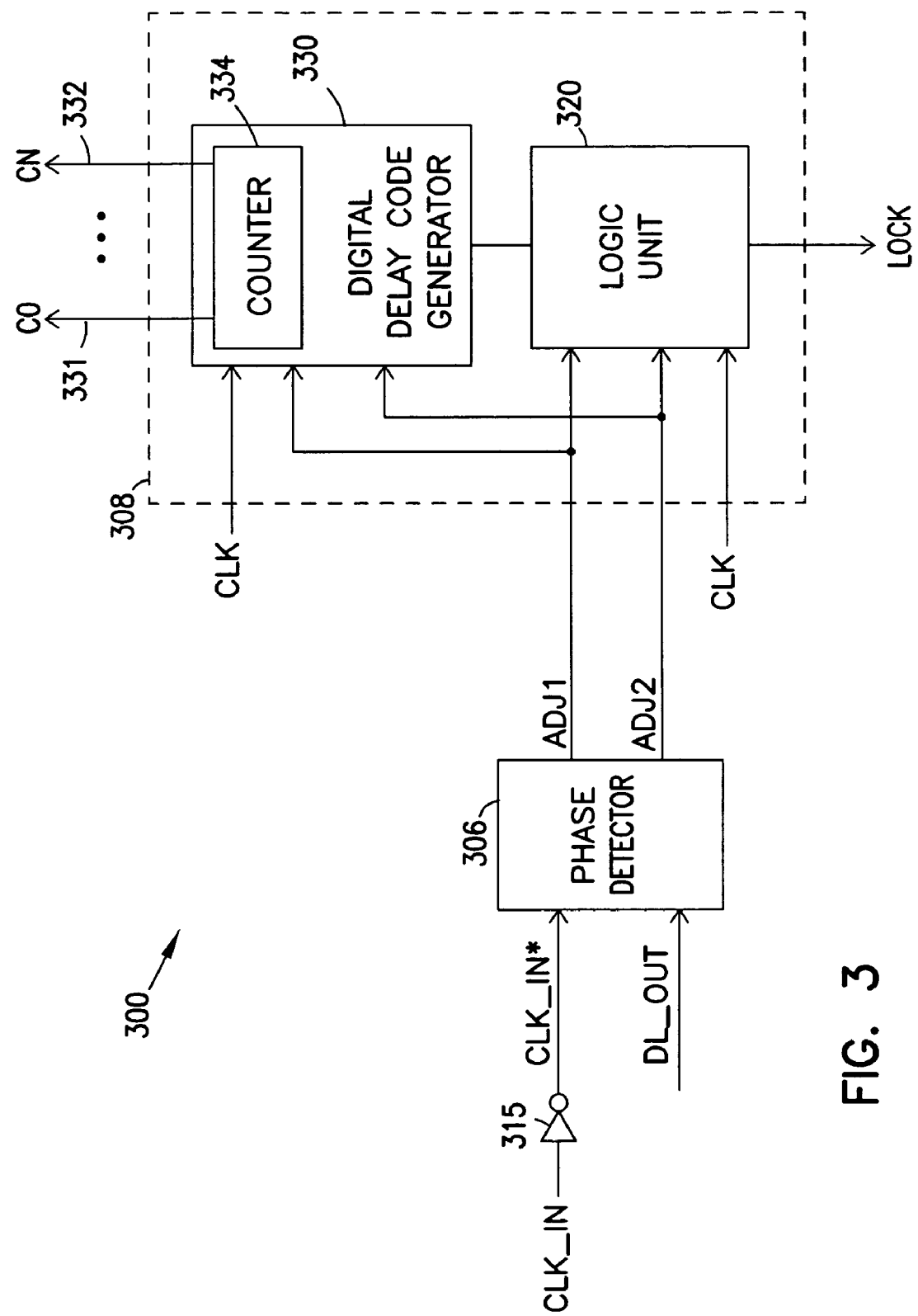
FIG. 3 shows a delay controller having a digital delay code generator according to embodiments of the invention.

FIG. 3 shows a delay controller 300 having a digital delay code generator 330 according to embodiments of the invention. Delay controller 300 includes a phase detector 306, an inverter 315, and a code adjuster 308 having a logic unit 320, and a digital delay code generator 330. Phase detector 306 receives input signals CLK_IN* and DL_OUT and activate adjust signals ADJ1 and ADJ2. Logic unit 320 responds to the ADJ1 and ADJ2 signals to control a lock signal LOCK. Digital delay code generator 330 responds to the ADJ1 and ADJ2 signals to generate a number of code bits C0-CN on bit lines 331 and 332.

Phase detector 306 compares the signal relationship between the CLK_IN* and DL_OUT signals. In some embodiments, phase detector 306 compares the rising edges (or falling edges) of the CLK_IN* and DL_OUT signals to control the ADJ1 and ADJ2 signals. For example, phase detector 306 activates the ADJ1 signal and deactivates the ADJ2 signal when the rising edge of the CLK_IN* signal leads the rising edge of the DL_OUT signal. As another example, phase detector 306 activates the ADJ2 signal and deactivates the ADJ1 signal when the rising edge of the CLK_IN* signal lags the rising edge of the DL_OUT signal. In some embodiments, phase detector deactivates both of the ADJ1 and ADJ2 signals when the edges (for example, rising edges) of the CLK_IN* and DL_OUT signals are aligned which is also when the CLK_IN* and DL_OUT signals have an equal phase.

In some embodiments, logic unit 320 is configured to activate the LOCK signals when both of the ADJ1 and ADJ2 signals have the same signal level. For example, logic unit 320 activates the LOCK signal when both of the ADJ1 and ADJ2 signals have a low signal level. In other embodiments, logic unit 320 is configured to activate the LOCK signals when none of the ADJ1 and ADJ2 signals is activated within a number of cycles of a clock signal CLK. For example, logic unit 320 activates the LOCK signal when none of the ADJ1 and ADJ2 signals is activated within three cycles of the CLK signal.

Digital delay code generator 330 includes a counter 334 having counter bit lines connected to bit lines 331 and 332. In FIG. 3, bit lines 331 and 332 are also referred to as counter bit lines. In some embodiments, counter 334 is an up down counter. The combination of code bits C0-CN represents a binary value (digital value), which corresponds to the count value of counter 334. Digital delay code generator 330 uses counter 334 to adjust the value of the C0-CN code bits based on the ADJ1 and ADJ2 signals. In some embodiments, digital delay code generator 320 sets the value of counter 334 such that the value of the C0-CN code bits corresponding to a minimum delay of a delay line such as delay line 104 of FIG. 1.

In some embodiments, digital delay code generator 330 adjusts the value of the C0-CN code bits by increasing or decreasing the count value of counter 334. For example, digital delay code generator 330 may increase the count value of counter 334 when the ADJ1 signal is activated and decreases the count value of counter 334 when the ADJ2 signal is activated.

In some embodiments, digital delay code generator 330 stops adjusting the value of the C0-CN code bits when both of the ADJ1 and ADJ2 signals have the same signal level. In other embodiments, digital delay code generator 330 stops adjusting the value of the C0-CN code bits when none of the ADJ1 and ADJ2 signals is activated within a number of cycles of a clock signal CLK. In some other embodiments, digital delay code generator 330 stops adjusting the value of the C0-CN code bits when the LOCK signal is activated by logic unit 320.

In some embodiments, delay controller 300 of FIG. 3 may be used to control a delay line such as delay line 104 of FIG. 1. In these embodiments, digital delay code generator 320 may set the value of counter 334 such that the value of the C0-CN code bits causes the delay line to have an initial delay value. In some embodiments, the initial delay value is a minimum delay value within the delay value range of the delay line. In other embodiments, the initial delay value is any value within the delay value range of the delay line.

In some embodiments, delay controller 300 is substituted for delay controller 105 of FIG. 1.

Figure 4:
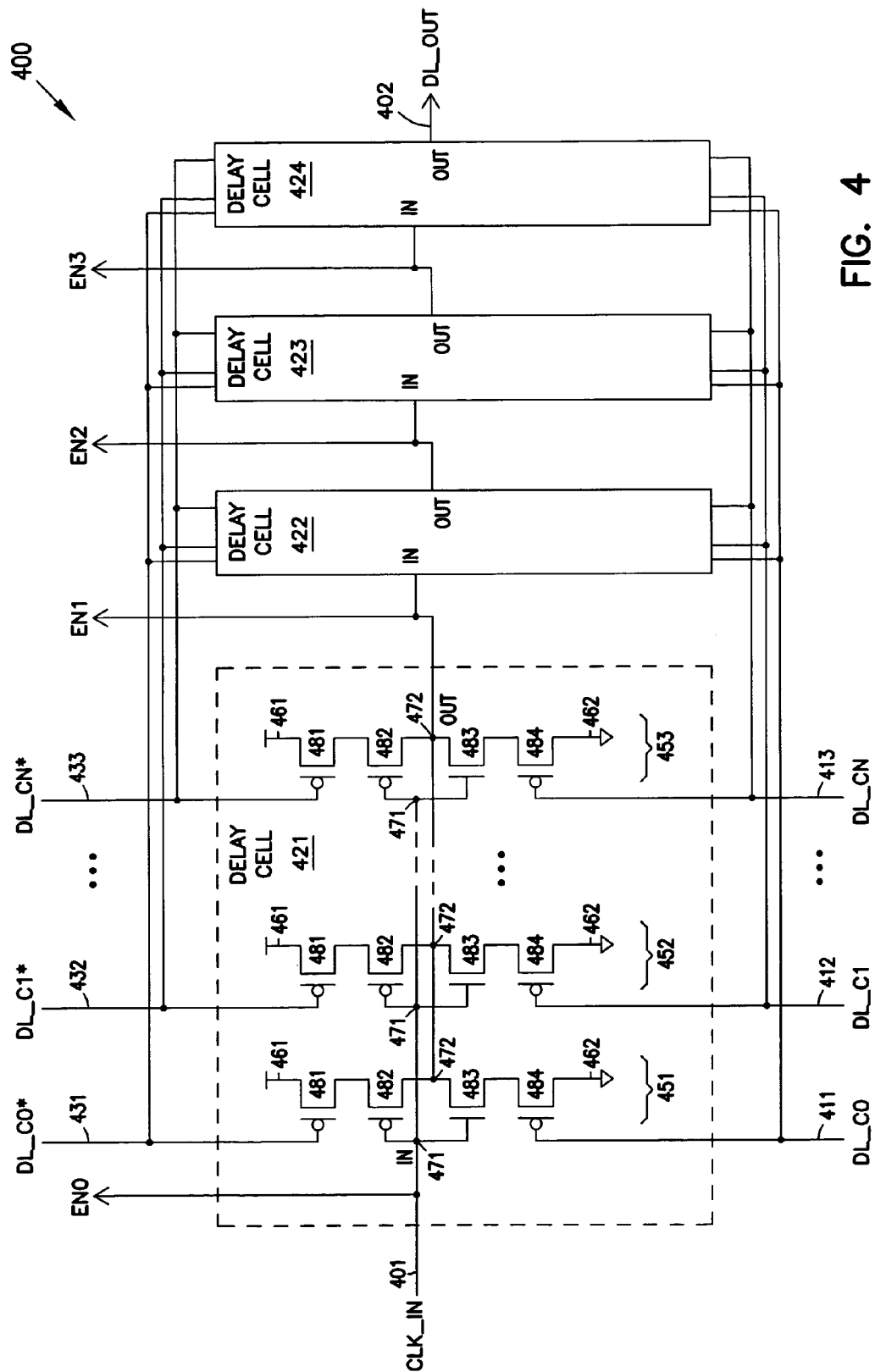
FIG. 4 shows a delay line having variable delay cells according to embodiments of the invention.

FIG. 4 shows a delay line 400 having variable delay cells according to embodiments of the invention. Delay line 400 includes a number of delay cells 421-424 (421, 422, 423, and 424) for applying a delay to an input signal CLK_IN at an input node 401 to generate an output signal DL_OUT at an output node 402. The DL_OUT signal is a delay version of the CLK_IN signal. The CLK_IN and DL_OUT signals have a fixed signal relationship. In some embodiments, the CLK_IN and DL_OUT signals are 180 degrees out of phase. In other embodiments, the DL_OUT signal is N degrees out of phase with the CLK_IN signal, wherein N is zero to 360. For example, N may be 90 or 270.

Delay line 400 also generates a number of cell output signals EN0, EN1, EN2, and EN3. The EN0 signal is the CLK_IN signal. The EN1, EN2, and EN3 signals are the signals at cell output nodes of delay cells 421, 422, and 423, respectively. In some embodiments, each of the EN1, EN2 and EN3 signals has a fixed signal relationship with each other. For example, the EN2 signal is the EN1 signal delayed by a first amount of delay; the EN3 signal is the EN2 signal delay by a second amount of delay where the second amount of delay is equal to the first amount of delay. Each of the EN1, EN2, and EN3 signals has a fixed delay equal to N times $T_{CK}$ (N $T_{CK}$) relative to the CLK_IN signal, where N a real number less than one and $T_{CK}$ is the cycle (period) of the of CLK_IN signal. For example, each of the EN1, EN2, and EN3 signal may be the CLK_IN signal delayed by a multiple of ⅛ $T_{CK}$ (one-eight clock cycle) of CLK_IN signal. As another example, each of the EN1, EN2, and EN3 signal may be the CLK_IN signal delayed by a multiple of ¼ $T_{CK}$ (one-fourth clock cycle) of CLK_IN signal.

Each of the delay cells 421-424 is a variable delay cell. Each of the delay cells 421-424 applies an equal amount of delay to the signal path of the CLK_IN signal between nodes 401 and 402. Each cell includes a number of delay control nodes 411, 412, 413, 431, 432, and 433. A number of delay code bits (signals) DL_C0, DL_C1, DL_CN and DL_C0*, DL_C1*, DL_CN* control the amount of delay in each of the cells 421-424. These code bits form a number of pairs of code bits. For example, code bits DL_C0 and DL_C0* form a pair of code bits. Other pairs of code bits include DL_C1 and DL_C1*, and DL_CN and DL_CN*. The code bits in each pair may be represented by a pair of signals in which one signal is an inverted version of the other signal. For simplicity, the code bits DL_C0, DL_C1, and DL_CN and DL_C0*, DL_C1*, and DL_CN* are referred together as the DL_C code.

In some embodiments, the DL_C code is a digital code. For example, the DL_C may be a combination of binary bits representing a binary value. The DL_C code of FIG. 4 may represent the DL_CODE of FIG. 1.

For clarity, FIG. 4 shows detailed structure of only delay cell 421. Other delay cells 422, 423, and 424 have a construction similar to that of delay cell 421.

Delay cell 421 includes a number of delay stages 451, 452, and 453 connected parallel between supply nodes 461 and 462. Each of the delay stages includes an input node 471 and an output node 472. All input nodes 471 within one delay cell are connected together. All output nodes 472 within one delay cell are connected together. The combination of input nodes 471 of the delay stages within one delay cell is also the input node (cell input node) of the delay cell. The combination of output nodes 472 of the delay stages within one delay cell also the output node (cell output node) of delay cell.

The output node of one delay cell connects to the input node of another delay cell in the series. For example, output node 472 of delay cell 421 connects to an input node (IN) of delay cell 422. For clarity, the input nodes and the output nodes of delay cells 422, 423, and 424 are labeled IN and OUT, respectively. All delay cells 421-424 have an equal number of delay stages.

Each of the delay stages 451, 452, and 453 includes a number of transistors 481-484 (481, 482, 483, and 484) connected in series between nodes 461 and 462. The transistors in each stage form a current path in each stage. For example, transistors 481-484 in delay stage 451 form a current path between nodes 461 and 462. Since delay cells 421 has a number of delay stages in parallel between nodes 461 and 462, a number of parallel current paths exists in delay cell 421 (one current path exists in each delay stage).

The amount of current in each current path is controlled by a pair of code bits of the DL_C code. For example, in delay stage 451, code bits DL_C0 and DL_C0* control the gates transistors 481 and 484 to control the amount of current in delay stage 451. Thus, transistors 481 and 484 serve as switches to control the amount of current in each current path in which the gates of the transistors serve as switch control nodes of the switches. Similarly, the amount of current in delay stage 452 is controlled by code bits DL_C1 and DL_C1*. The amount of current in delay stage 453 is controlled by code bits DL_CN and DL_CN*. The amount of current in each delay cell may be increased or decreased by selecting a number active delay stages in each delay cell. An active (activated) delay stage is the delay stage with both transistors 481 and 484 are turned on. An inactive (deactivated) delay stage is the delay stage with one or both transistors 481 and 484 are turned off.

Since the amount of current in each delay cell is control by identical code bits DL_C, delay cells 421-424 have an equal amount of current. Since the amount of current in each delay cell is controlled by the code bits DL_C, in embodiments where the DL_C code is a digital code, the amount of current in each of the delay cells 421, 422, and 423 is controlled digitally.

The total amount of delay of delay line 400 depends on the delay of each of the delay cells 421-424. The amount of delay of each delay cell depends on the current in the current paths of each delay cell. Thus, by adjusting the current in the current paths of each delay cell, the total delay of delay line 400 is also adjusted. The current in the current paths of each delay cell is proportional to the number of active delay stages in each delay cell. Since each delay stage can be activated by the code bits of the DL_C code, the number of active delay stages can be selected by selecting the value of the code bits of the DL_C code.

In some embodiments, the DL_C code is a combination of binary bits. In these embodiments, different combination of the binary bits may be selected to produce different number of active delay stage. For example, the combination of binary bits 001 may be selected to activate delay stage 453 and deactivate stages 451 and 452. Thus, in the example, only one of the delay stages is activated in each of the delay cells 421-424. As another example, the combination of binary bits 110 may be selected to activate delay stages 451 and 452 and deactivate delay stage 453. Thus, in this example, two delay stages are activated in each of the delay cells 421-424.

In some embodiments, the delay stages in each of the delay cells 421-424 form an even number of current starved inverters in which each current starved inverter is formed by an odd number of delay stages and each current starved inverter is controlled by the same delay code such as the DL_C code. For example, delay cell 421 may include six delay stages in which a first group of three delay stages (such as delay stages 451, 452, and 453) forms a first current starved inverter and a second group of three delay stages (similar to delay stages 451, 452, and 453) forms a second current starved inverter connected in series with the first current starved inverter. The first and second current starved inverters in this example are controlled by the same DL_C code. Since all of the current starved inverters are controlled by the same delay code, all of the current starved inverters have an equal amount of delay.

In embodiments where each of the delay cells 4212-424 has M (M is an even number) current starved inverters and each of the EN1-EN3 signals has a fixed delay (N $T_{CK}$) relative to the CLK_IN signal, each current starved inverter has a delay of (N/M) $T_{CK}$ (or N divided by M times $T_{CK}$), where $T_{CK}$ is the cycle of the CLK_IN signal. For example, in embodiments where delay line 400 has eight (8) current starved inverters (two current staved inverters in each delay cell), the EN1, EN2, and EN3 signals have a delay of ⅛ $T_{CK}$, ¼ $T_{CK}$, and ⅜ $T_{CK}$ relative to the CLK_IN signal, respectively. In this example, all eight current starved inverters have an equal delay of 1/16 $T_{CK}$.

In delay line 400 of FIG. 4, since the DL_OUT signal is the CLK_IN signal delayed by an amount applied by delay cells 421-424, the relationship between the CLK_IN and DL_OUT can be adjusted by adjusting a delay in each delay cell. As described above, different values of the DL_C code may be selected to adjust the amount of delay in each delay cell.

In some embodiments, the value of the DL_C code is controlled by a delay controller such as delay controller 105 of FIG. 1 or delay controller 400 of FIG. 4.

In the embodiments represented by FIG. 4, delay line 400 includes four delay cells, as an example. In some embodiments, the number of delay cells of delay line 400 may be different from four. Therefore, in some embodiments, the number of cell output signals such as the EN0-EN3 signals may be different from four. Further, FIG. 4 shows each delay cell with three delay stages, as an example. In some embodiments, the number of delay stages in each of the delay cells may be different from three.

In some embodiments, delay line 400 is substituted for delay line 104 of FIG. 1.

Figure 5:
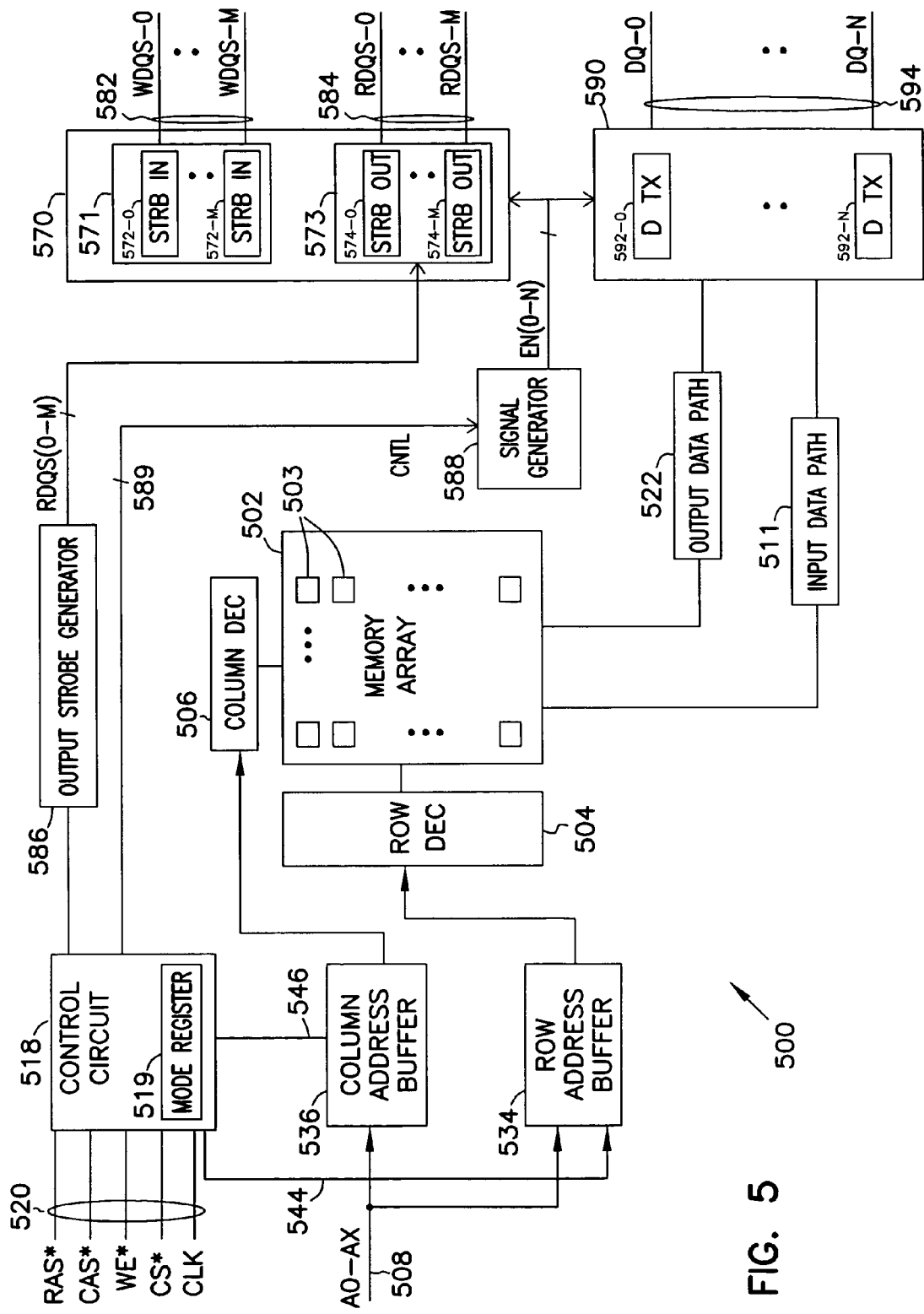
FIG. 5 shows a memory device according to embodiments of the invention.

FIG. 5 shows a memory device 500 according to embodiments of the invention. Memory device 500 may be a dynamic random access memory (DRAM) device, a static random access memory (SRAM) device, or a flash memory device. Examples of DRAM devices include synchronous DRAM (SDRAM), synchronous graphics random access memory (SGRAM), various generations of double data rate SDRAM (DDR SDRAM), various generations of Graphic Double Data Rate DRAM (GDDR), and Rambus DRAM devices. In FIG. 5, some elements of memory device 500 are omitted for clarity.

Memory device 500 includes a memory array 502 having a plurality of memory cells 503 for storing data. Memory cells 503 are arranged in rows and columns.

Row decoder 504 and column decoder 506 access memory cells 503 in response to address signals A0 through AX (A0-AX) provided on address lines 508.

A row address buffer 534 transfers row addresses on lines 508 to row decoder 504 based on a signal on line 544. A column address buffer 536 transfers column addresses on lines 508 to column decoder 506 based on a signal on line 546.

A control circuit 518 controls the operations of memory device 500 in response to control signals on control lines 520. Examples of the control signals on lines 520 include a Row Access Strobe signal RAS*, a Column Access Strobe CAS* signal, a Write Enable signal WE*, a Chip Select signal CS*, and a Clock signal CLK. Examples of the operations of memory device 500 include a read operation and a write operation. Control circuit 518 issues a READ command in the read operation and a WRITE command in the write operation.

The write operation writes input data from data lines or data terminals 594 to memory cells 503. The read operation reads output data from memory cells 503 to data lines 594. Data lines 594 are bi-directional data lines; these lines carry both of the input data provided to memory device 500 by an external source and the output data outputted from memory device 500. A combination of the address signals A0-AX on lines 508 provides the address of a row, or a column of memory cells 503 being read or written.

Control circuit 518 includes a mode register 519 to store values representing the operating codes of memory device 500. Examples of the operating codes include a write latency time interval and a read latency time interval.

Memory device 500 also includes a strobe transceiver circuit 570, a data transceiver circuit 590, an input data path 511, and an output data path 522. Data transceiver circuit 590 transfers data to and from memory device 500. Strobe transceiver circuit 570 transfers timing information of the data.

Strobe transceiver circuit 570 includes a write strobe unit 571 and a read strobe unit 573. Write strobe unit 571 has strobe input circuits (STRB IN) 572-0 through 572-M. Write strobe unit 571 transfers timing information of the input data. The write strobe signals (bits) WDQS-0 through WDQS-M on lines or strobe terminals 582 represent the timing information of the input data. An external source provides the WDQS-0 through WDQS-M signals together with the input data to memory device 500.

Read strobe unit 573 has strobe output circuits (STRB OUT) 574-0 through 574-M. Read strobe unit 573 transfers timing information of the output data. The read strobe signals RDQS-0 through RDQS-M on lines or strobe terminals 584 represent the timing information of the data outputted from memory device 500. An output strobe generator 586 generates the RDQS-0 through RDQS-M signals.

Data transceiver circuit 590 includes data transceivers (D TX) 592-0 through 592-N. Data transceivers 592-0 through 592-N are bi-directional circuits; they transfer data in both directions. Data transceivers 592-0 through 592-N transfer both of the input data and the output data. The data (data signals or data bits) DQ-0 through DQ-N on data lines 594 represent both of the input data and the output data. DQ-0 through DQ-N represent the input data when memory device 500 receives data during the write operation. DQ-0 through DQ-N represent the output data when memory device 500 outputs data during the read operation.

In some embodiments, each of the RDQS-0 through RDQS-M signals carries timing information of one of the DQ-0 through DQ-N signals; in these embodiments, the number of the RDQS-0 through RDQS-M signals is equal to the number of the DQ-0 through DQ-N signal (M=M). In other embodiments, each of the RDQS-0 through RDQS-M signals carries timing information of a group of the DQ-0 through DQ-N signals; in these embodiments, the number of the RDQS-0 through RDQS-M signals is less than the number of the DQ-0 through DQ-N signal (M<N).

Input data path 511 transfers data between data transceiver circuit 590 and memory array 502 during the write operation. Output data path 522 transfers data between data transceiver circuit 590 and memory array 502 during the read operation.

In some embodiments, lines 508, 520, 582, 584, and 594 correspond to pins or solder balls on a packaged integrated circuit of memory device 500. In other embodiments, lines 508, 520, 582, 584, and 594 correspond to pads on a circuit die of memory device 500.

Memory device 500 further includes a signal generator 588 responsive to control signals CNTL on lines 589 to generate a number of enable signals EN(0-N). In some embodiments, signal generator 588 includes embodiments of signal generator 100 described in FIGS. 1 through 4. In some embodiments, the EN(0-N) signals include one of the EN0-EN3 signals described in FIGS. 1 through 4. In other embodiments, the EN(0-N) signals include a combination of the EN0-EN3 signals described in FIGS. 1 through 4.

In some embodiments, signal generator 588 includes a signal generator such as signal generator 100 in which the signal generator includes a small number of delay cells such that signal generator 588 may be a relatively compact circuit. Thus, embodiments exist where signal generator 588 may be locally formed in a relatively small area in an appropriate location of memory device 500 to provide a range of signals such as the EN0-EN3 signals described in FIGS. 1 through 4.

In some embodiments, the EN(0-N) signals serve as timing signals to control a combination of strobe input circuits (STRB IN) 572-0 through 572-M, strobe output circuits (STRB OUT) 574-0 through 574-M, and data transceiver 592-0 through 592-N. In other embodiment, the EN(0-N) signals serve as control timing signals in other circuit parts of memory device 500.

Figure 6:
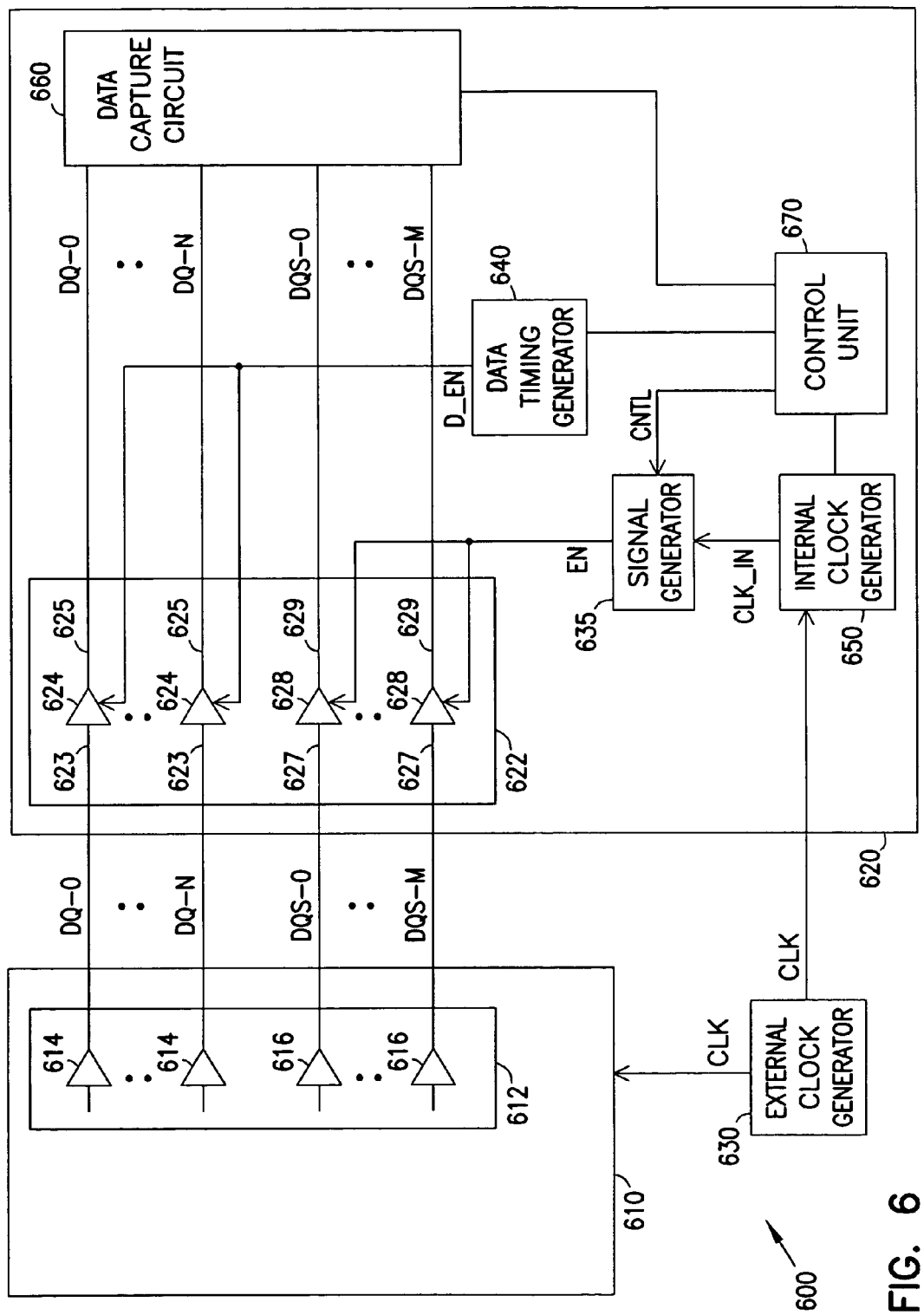
FIG. 6 shows a memory system according to embodiments of the invention.

FIG. 6 shows memory system 600 according to embodiments of the invention. Memory system 600 includes devices 610 and 620, and an external clock generator 630.

External clock generator 630 provides an external clock generator CLK to both of the devices 610 and 620. In some embodiments, external clock generator 630 includes an oscillator on a circuit board.

Device 610 includes a transceiver circuit 612 having a number of data drivers 614 for providing a number of data signals DQ-0 through DQ-N, and a number of strobe drivers 616 for providing a number of strobe signals DQS-0 through DQS-M. Each of the strobe signals DQS-0 through DQS-M carries timing information of one or more of the data signals DQ-0 through DQ-N.

Device 620 includes transceiver circuit 622 having a number of data receivers 624 for receiving the DQ-0 through DQ-N signals, and a number of strobe receivers 628 for receiving the DQS-0 through DQS-M signals. Each of the strobe signals DQS-0 through DQS-M carries timing information of one or more of the data signals DQ-0 through DQ-N.

A signal generator 635 provides an enable signal EN to control strobe receivers 628 in an operation such as a write operation of device 620. The EN signal activates receivers 628 to allow the DQS-0 through DQS-M signals to pass from input nodes 627 to output nodes 629 of receivers 628.

A data timing generator 640 provides a data enable signal D_EN to control data receivers 624 in the operation such as the write operation of device 620. The D_EN signal activates receivers 624 to allow the DQ-0 through DQ-N signals to pass from input nodes 623 to output nodes 625 of receivers 624.

In some embodiments, signal generator 635 includes embodiments of a signal generator such as signal generator 100 and other circuit elements described in FIGS. 1 through 5. In other embodiments, data timing generator 640 includes embodiments of a signal generator such as signal generator 100 and other circuit elements described in FIGS. 1 through 5. In some other embodiments, both of the signal generator 635 and data timing generator 640 include embodiments of a signal generator such as signal generator 100 and other circuit elements described in FIGS. 1 through 5.

Device 620 also includes an internal clock generator 650 for providing an input signal CLK_IN to signal generator 635. A data capture circuit 660 captures the DQ-0 through DQ-N signals and the DQS-0 through DQS-M signals for further processing. A control unit 670 controls other circuits of device 600.

The EN, CLK, and CLK_IN signals are similar to that of the signals described in FIGS. 1 through 4. As described in FIGS. 1 through 4, signal generator 100 provides a range of enable signals such as the EN0-EN3 signals in which one of the EN0-EN3 signals is selected to be the EN signal. In FIG. 6, signal generator 635 may include embodiments of generator 100. Thus, signal generator 635 also provides a range of enable signals similar to the EN0-EN3 signals. This range of enable signals provides device 620 with a flexibility to select an appropriate signal among the range of enable signals to appropriately control the transfer of signals such as the DQS-0 through DQS-M signals. Further, the range of enable signals provides a useful alterative where the signals such as the CLK and CLK_IN signals are improper options.

In some embodiments, device 610 is a memory device such as memory device 500 of FIG. 5 and device 620 is a memory controller. In other embodiments, device 610 is a memory device such as memory device 500 of FIG. 5 and device 620 is a processing unit such as a microprocessor. In some embodiments, both of the devices 610 and 620 are formed in a single chip.

Figure 7:
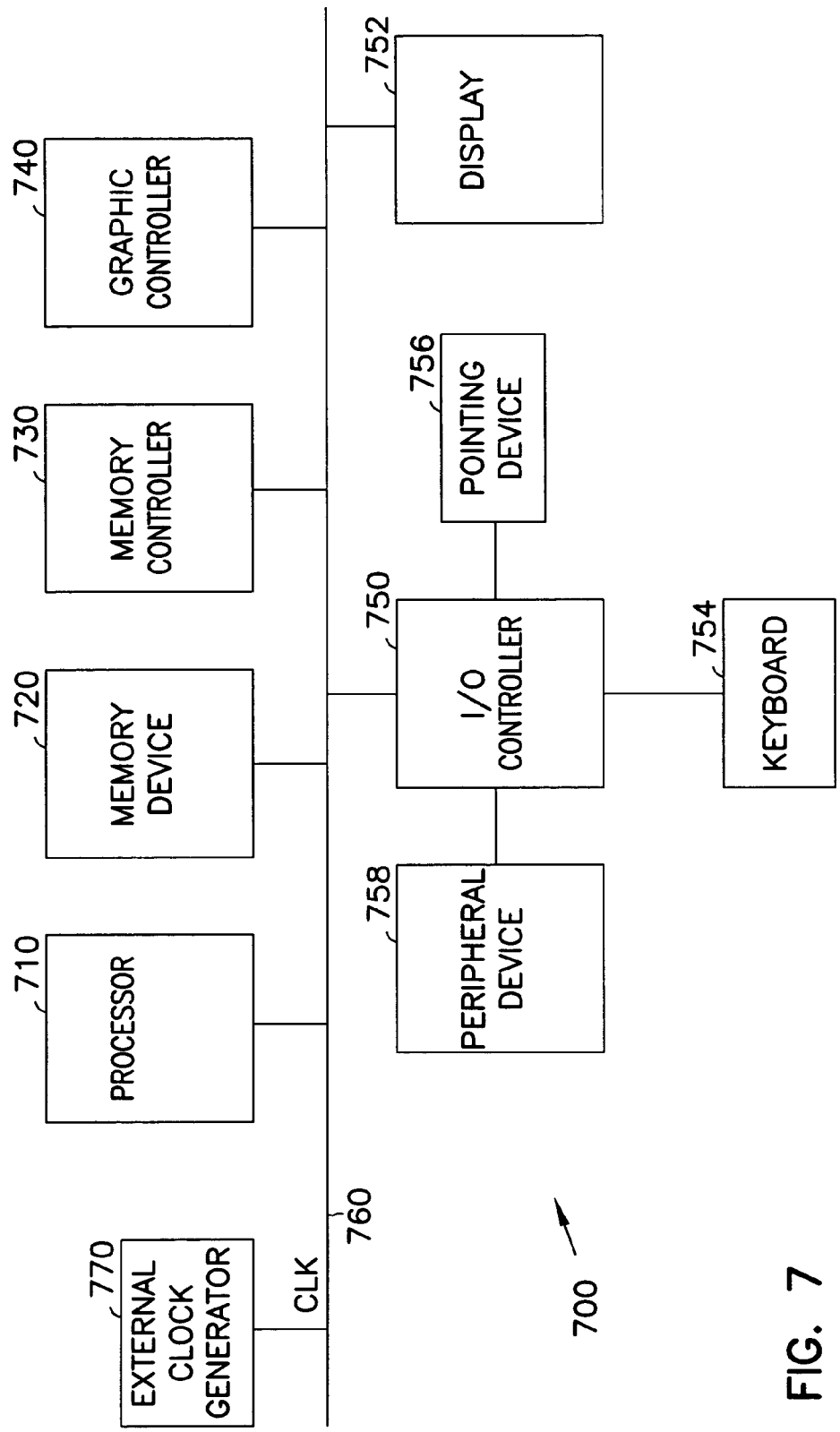
FIG. 7 shows an electronic system according to embodiments of the invention.

FIG. 7 shows an electronic system 700 according to embodiments of the invention. Electronic system 700 includes a processor 710, a memory device 720, a memory controller 730, a graphic controller 740, an input and output (I/O) controller 750, a display 752, a keyboard 754, a pointing device 756, and a peripheral device 758. A bus 760 connects all of these devices together. A clock generator 770 provides an external clock signal CLK to at least one of the devices of electronic system 700. Two or more devices shown in electronic system 700 may be formed in a single chip. In some embodiments, electronic system 700 may omit one or more devices shown in FIG. 7.

Bus 760 may be conducting traces on a circuit board or may be one or more cables. Bus 760 may also connect the devices of electronic system 700 by wireless means such as electromagnetic radiation (e.g., radio waves). Peripheral device 758 may be a printer, an optical device (e.g., a CD-ROM device or a DVD device), a magnetic device (e.g., floppy disk driver), or an audio device (e.g., a microphone). Memory device 720 may be a dynamic random access memory (DRAM) device, a static random access memory (SRAM) device, or may be a flash memory device, or a combination thereof.

At least one of the devices shown in electronic system 700 includes embodiments of a signal generator such as signal generator 100 and other circuit elements described in FIGS. 1 through 6. Therefore, at least one of the devices shown in electronic system 700 has the option to select an enable signal from a range of enable signals such as the EN0-EN3 signals described in FIGS. 1 through 6. The option to select an enable signal from a range of enable signals may allows at least one of the devices in electronic system 700 to properly transfer data within the same device or among two or more devices of electronic system 700.

Electronic system 700 of FIG. 7 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 8:
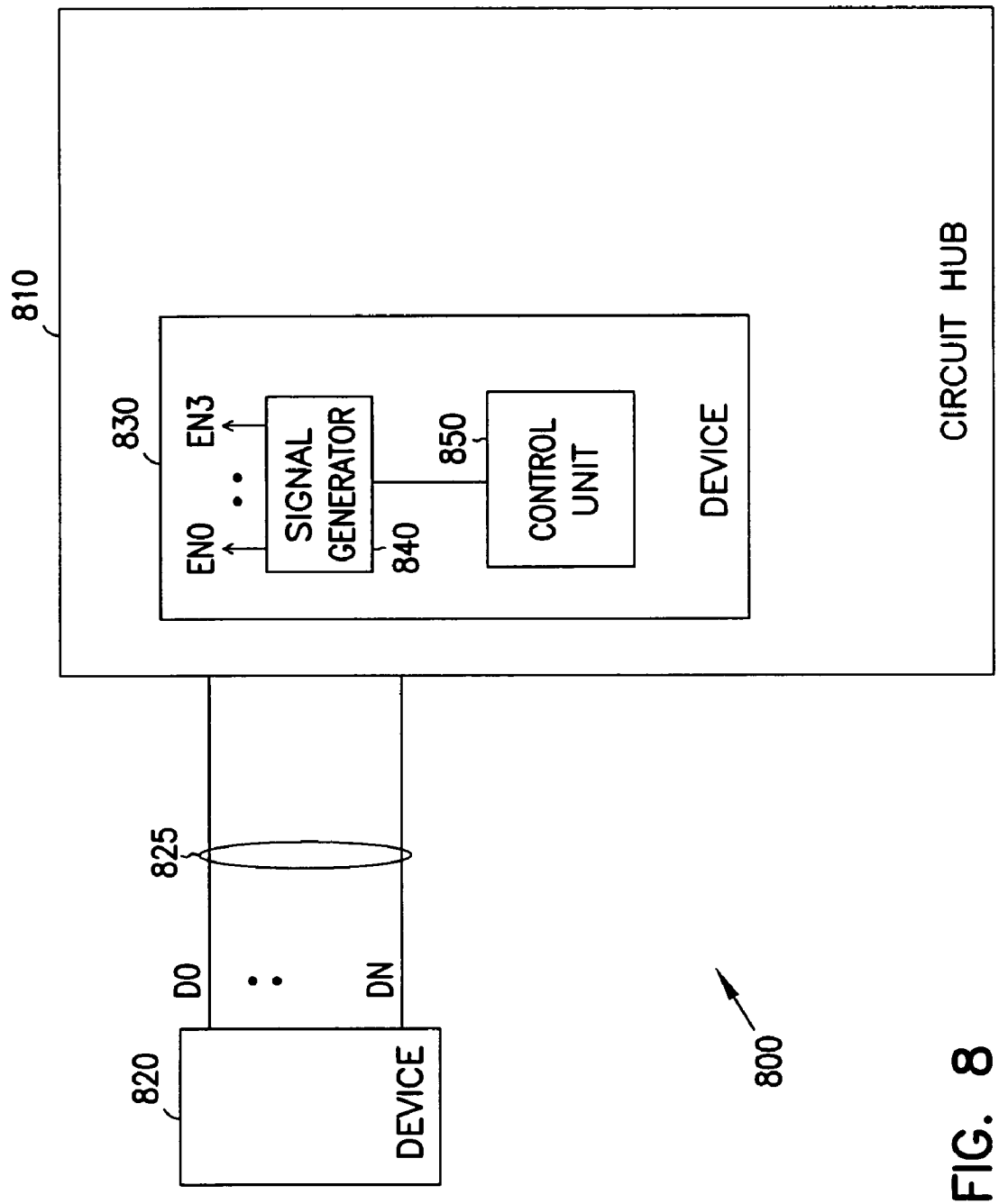
FIG. 8 shows a testing system according to embodiments of the invention.

FIG. 8 shows a testing system 800 according to embodiments of the invention. Testing system 800 includes a circuit hub 810 connected to a device 820 via a number of conducting lines or channels 825. In some embodiments, circuit hub 810 is a tester and device 820 is a semiconductor device. In other embodiments, circuit hub 810 is a tester and device 820 is a memory device such as memory device 500 of FIG. 5. In some embodiments, the D0-DN signals on lines 825 represents the combination of the DQ-0 through DQ-N signals, the WDQS-0 through WDQS-M signals, and the RDQS-0 through RDQS-M signals of FIG. 5. In other embodiments, the D0-DN signals on lines 825 represents the combination of the DQ-0 through DQ-N signals and the DQS-0 through DQS-M signals of FIG. 6.

In some embodiments, device 820 operates at a first frequency. In other embodiments, device 820 operates at a second frequency in which the second frequency is unequal to the first frequency. Circuit hub 810 is configured to manage data transfer with device 820. In some embodiments, circuit hub 810 is configured to test device 820 where device 820 operates at varying frequencies.

Circuit hub 810 includes a device 830 having a signal generator 840 and a control unit 850. In some embodiments, device 830 is a memory controller. In other embodiments, device 830 is a processing unit such as a processor. Signal generator 840 of device 830 generates a number of enable signal EN0-EN3 (EN0 through EN3). Control unit 810 provides control for device 830. In some embodiments, control unit 810 is configured to scan the EN0-EN3 signals to select one of the EN0-EN3 signals in which the selected signal allows circuit hub 810 to properly manage the transfer of the D0-DN signals between device 820 and circuit hub 810. In some embodiments, device 830 of circuit hub 810 includes embodiments of device 620 of FIG. 6.

Signal generator 830 includes embodiments of signal generator 100, 588, or 635 described in FIGS. 1 through 7. In FIG. 8, the EN0-EN3 signals represent the EN0-EN3 signals described in FIGS. 1 through 7. As described in FIGS. 1 through 7, the EN0-EN3 signals provide a range of enable signals in which an enable signal within the range may be selected to appropriately control a transfer of signals between devices.

In FIG. 8, since devices 820 operates at varying frequencies, device 820 may transfer the D0-DN signals at varying frequency domains. The EN0-EN3 signals provide circuit hub 810 with a flexibility to properly manage the transfer of the D0-DN signals by selecting among the EN0-EN3 signals the signal that suits the frequency domain of circuit hub 810 with each frequency domain of device 810. For example, circuit hub 810 may select the EN1 signal to mange the transfer of the D0-DN signals when device 820 operates at a first frequency and circuit hub 810 may select the EN2 signal to mange the transfer of the D0-DN signals when device 820 operates at a second frequency unequal to the first frequency. Therefore, circuit hub 810 is configured to select the EN0-EN3 signals based on the operating frequency of device 810 to manage the transfer of the D0-DN signals between circuit hub 810 and device 820.

In the description of FIGS. 1 through 7, portions and features in some embodiments may be included in or substituted for those of the other embodiments.

CONCLUSION

Various embodiments of the invention provide circuits and methods for generating a range of stable signals to improving operations within the same device or operations among different devices.

As integrated circuit devices become more advanced, one part of the device may operate at one frequency and another part of the device or of another device may operate at another frequency. Therefore, synchronizing different operations in different parts of the same device or among different devices may be complex. Embodiments of the present invention provide a technique to provide flexibility for selecting a signal among a range of signals so that the selected signal may improve the accuracy of the transfer of data within the same device or among two or more devices. Further, embodiments of the present invention also compensate for any variations in environment factors such as manufacturing process, operating voltage, and temperature so that the selected signal and the range of signals remain stable despite the variations in the environment factors. Moreover, embodiments of the present invention offer a relatively compact circuit for a signal generator that operates at a wide range of frequencies and with reduced current or power consumption.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A device comprising:
    a delay line including a delay input node, a delay output node, and a number of delay cells coupled between the delay input node and the delay output node, each of the delay cells including a number of delay control nodes for receiving a digital delay code, wherein each of the delay cells includes a number of current paths coupled in parallel between a first supply node and a second supply node, and wherein the delay cells are configured to control an amount of current on each of current paths based on the value of the delay code;
    a phase detector including a first input node coupled to the delay input node, and a second input node coupled to the delay output node; and
    a code adjuster including a number of output nodes coupled to the delay control nodes, and a number of input nodes responsive to the phase detector for adjusting the delay code.

2. The device of claim 1, wherein each of the delay cells includes a number of delay stages coupled in parallel between a first supply node and a second supply node.

3. The device of claim 2, wherein each of the delay stages includes a number of transistors coupled in series between the first and second supply nodes, wherein at least one transistor among the plurality of transistors includes a gate coupled to one of the delay control nodes.

4. The device of claim 3, wherein the code adjuster includes a counter having a number of counter bit lines, each of the counter bit lines coupled to one of the delay control nodes.

5. A device comprising:
    a delay line including a delay input node, a delay output node, and a number of delay cells coupled between the delay input node and the delay output node, each of the delay cells including a number of delay control nodes for receiving a digital delay code;
    a phase detector including a first input node coupled to the delay input node, and a second input node coupled to the delay output node; and
    a code adjuster including a number of output nodes coupled to the delay control nodes, a number of input nodes responsive to the phase detector for adjusting the delay code, and a digital delay code generator configured to generate a number of binary bits representing the delay code, wherein each of the delay cells includes a number of current paths coupled in parallel between a first supply node and a second supply node, wherein each of the delay cells is configured for controlling an amount of current on each of current paths based on the value of the delay code.

6. The device of claim 5, wherein each of the current paths includes a switch coupled in series between the first and second supply nodes, wherein the switch includes a control node coupled to a first delay control node among the delay control nodes.

7. The device of claim 6, wherein each of the current paths further includes a second switch coupled in series between the first and second supply nodes, wherein the second switch includes a control node coupled to a second delay control node among the delay control nodes.

8. A system comprising:
    a first device having at least one data terminal for providing a data signal, and at least one strobe terminal for providing a strobe signal representing a timing of the data signal; and
    a second device having at least one data receiver coupled to the data terminal of the first device, at least one strobe receiver responsive to an enable signal for receiving the strobe signal from the first device, and a signal generator coupled to the strobe receiver, wherein the signal generator includes:
        a delay locked circuit having a delay input node for receiving an input signal, a delay output node to provide a delayed output signal, a number of delay control nodes, and a number of variable delay cells coupled in series between the delay input and delay output nodes, wherein each of the delay cells includes a number delay control nodes, a cell output node for providing a cell output signal, and a number of delay stages coupled in parallel between a first supply node and a second supply node, wherein each of the delay stages includes at least one switch coupled in series between the first and second supply nodes for controlling an amount of current of between the first and second supply nodes; and
        an enable controller coupled to the delay locked circuit for selecting the cell output signal from the cell output node of at least two of the variable delay cells to be the enable signal.

9. The system of claim 8, wherein the delay locked circuit further includes:
    an inverter including an input coupled to the delay input node, and an inverter output node;
    a phase detector including a first input node coupled to the inverter output node, and a second input node coupled to the delay output node, and a number of output nodes; and
    a digital delay code generator including a number of input nodes coupled to the output nodes of the phase detector, and a number of bit lines coupled to the delay control nodes.

10. A system comprising:
a first device having at least one data terminal for providing a data signal, and at least one strobe terminal for providing a strobe signal representing a timing of the data signal; and
a second device having at least one data receiver coupled to the data terminal of the first device, at least one strobe receiver responsive to an enable signal for receiving the strobe signal from the first device, and a signal generator coupled to the strobe receiver, wherein the signal generator includes:
a delay locked circuit having a delay input node for receiving an input signal, a delay output node to provide a delayed output signal, a number of delay control nodes, and a number of variable delay cells coupled in series between the delay input and delay output nodes, wherein each of the delay cells includes a number delay control nodes, a cell output node for providing a cell output signal, and a number of delay stages coupled in parallel between a first supply node and a second supply node, wherein each of the delay stages includes at least one switch coupled in series between the first and second supply nodes for controlling an amount of current of between the first and second supply nodes;
a digital delay code generator including a counter having number of counter bit lines coupled to bit lines; and
an enable controller coupled to the delay locked circuit for selecting the cell output signal from the cell output node of at least two of the variable delay cells to be the enable signal.

11. A system comprising:
a first device having at least one data terminal for providing a data signal, and at least one strobe terminal for providing a strobe signal representing a timing of the data signal; and
a second device having at least one data receiver coupled to the data terminal of the first device, at least one strobe receiver responsive to an enable signal for receiving the strobe signal from the first device, and a signal generator coupled to the strobe receiver, wherein the signal generator includes:
a delay locked circuit having a delay input node for receiving an input signal, a delay output node to provide a delayed output signal, a number of delay control nodes, and a number of variable delay cells coupled in series between the delay input and delay output nodes, wherein each of the delay cells includes a number delay control nodes, and a cell output node for providing a cell output signal, the delay locked circuit further including:
an inverter including an input coupled to the delay input node, and an inverter output node;
a phase detector including a first input node coupled to the inverter output node, and a second input node coupled to the delay output node, and a number of output nodes; and
a digital delay code generator including a number of input nodes coupled to the output nodes of the phase detector, and a number of bit lines coupled to the delay control nodes, wherein the delay locked circuit is configured for providing the delayed output signal at 180 degrees out of phase with the input signal; and
an enable controller coupled to the delay locked circuit for selecting the cell output signal from the cell output node of at least two of the variable delay cells to be the enable signal.

12. The system of claim 11, wherein the delay locked circuit is configured for providing the cell output signal delayed from the input signal by a delay equal to a multiple of one-eighth of a cycle of the input signal.

13. The system of claim 12, wherein the delay locked circuit is configured for providing the cell output signal in which the delay from one cell delay signal to another cell output signal is equal to a multiple of one-eighth of a cycle of the input signal.

14. A system comprising:
a device having terminals for transfer data at an operating frequency;
a circuit hub coupled to the device, the circuit hub including a signal generator for providing a number of enable signals, the circuit hub is configured for selecting one the enable signals based on the operating frequency of the device to manage a transfer of the data between the circuit hub and the device, wherein the signal generator includes:
a delay locked circuit having a number of variable delay cells coupled in series between a delay input node and a delay output node, wherein each of the delay cells includes a number delay control nodes for receiving an identical digital delay code and a number of delay stages coupled in parallel between a first supply node and a second supply node, wherein each of the delay stages includes at least one switch coupled in series between the first and second supply nodes for controlling an amount of current between the first and second supply nodes; and
a selector coupled to a number of output nodes of least two of the variable delay cells.

15. The system of claim 14, wherein the circuit hub is a tester.

16. The system of claim 15, wherein the device is a semiconductor device.

17. The system of claim 16, wherein the delay locked circuit further includes:
an inverter including an input coupled to the delay input node, and an inverter output node;
a phase detector including a first input node coupled to the inverter output node, and a second input node coupled to the delay output node, and a number of output nodes; and
a digital delay code generator including a number of input nodes coupled to the output nodes of the phase detector, and a number of bit lines coupled to the delay control nodes.

18. A system comprising:
a device having terminals for transfer data at an operating frequency;
a circuit hub coupled to the device, the circuit hub including a signal generator for providing a number of enable signals, the circuit hub is configured for selecting one the enable signals based on the operating frequency of the device to manage a transfer of the data between the circuit hub and the device, wherein the signal generator includes:
a delay locked circuit having a number of variable delay cells coupled in series between a delay input node and a delay output node, wherein each of the delay cells includes a number delay control nodes for receiving an identical digital delay code; and
a selector coupled to a number of output nodes of least two of the variable delay cells, wherein the signal generator is configured for providing the enable signals in which each of the enable signals has a fixed signal relationship with each other.

19. The system of claim 18, wherein the variable delay cells have an equal amount of delay.

* * * * *

UNITED STATES PATENT AND TRADEMARK OFFICE
CERTIFICATE OF CORRECTION

PATENT NO. : 7,664,216 B2 Page 1 of 1
APPLICATION NO. : 10/912441
DATED : February 16, 2010
INVENTOR(S) : Curt Schnarr It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1204 days.

Signed and Sealed this

Thirtieth Day of November, 2010

David J. Kappos
*Director of the United States Patent and Trademark Office*